(12) United States Patent
Yeung et al.

(10) Patent No.: US 8,429,580 B2
(45) Date of Patent: Apr. 23, 2013

(54) METHOD FOR PREPARING FOR AND FORMALLY VERIFYING A MODIFIED INTEGRATED CIRCUIT DESIGN

(75) Inventors: Raymond C. Yeung, Round Rock, TX (US); Irfan Waheed, Austin, TX (US); Mark H. Nodine, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/213,415

(22) Filed: Aug. 19, 2011

(65) Prior Publication Data

US 2011/0307848 A1 Dec. 15, 2011

Related U.S. Application Data

(63) Continuation-in-part of application No. 13/128,153, filed as application No. PCT/US2009/062337 on Oct. 28, 2009.

(60) Provisional application No. 61/484,997, filed on May 11, 2011, provisional application No. 61/112,537, filed on Nov. 7, 2008.

(51) Int. Cl.
*G06F 17/50* (2006.01)

(52) U.S. Cl.
USPC ........... 716/107; 716/103; 716/104; 716/105; 716/106; 716/111; 716/136

(58) Field of Classification Search .......... 716/103–107, 716/111, 136
See application file for complete search history.

(56) References Cited

U.S. PATENT DOCUMENTS

| | | | |
|---|---|---|---|
| 6,298,472 B1 * | 10/2001 | Phillips et al. | 716/105 |
| 6,446,243 B1 * | 9/2002 | Huang et al. | 716/106 |
| 7,137,084 B1 | 11/2006 | Chen | |
| 7,159,198 B1 * | 1/2007 | Ip et al. | 716/106 |
| 7,340,700 B2 * | 3/2008 | Emerson et al. | 716/111 |

(Continued)

FOREIGN PATENT DOCUMENTS

| | | |
|---|---|---|
| WO | 2010053603 | 5/2010 |
| WO | 2010053779 | 5/2010 |

OTHER PUBLICATIONS

International Search Report in application No. PCT/US09/62337 mailed Dec. 22, 2009.

(Continued)

*Primary Examiner* — Nghia Doan
(74) *Attorney, Agent, or Firm* — Stephen J. Curran; Meyertons, Hood, Kivlin, Kowert & Goetzel, P.C.

(57) ABSTRACT

A method for preparing an IC design that has been modified to be formally verified with a reference IC design. Because some formal verification tools cannot handle the complexity often associated with sequential equivalence checking at the top level of a circuit, the modified IC design may be instantiated into a number of different design versions, each having different levels of modification complexity. In addition, the reference IC design and the modified versions may be decomposed into a datapath and control path. The reference IC design and each of the modified IC design versions may also use wrappers to encapsulate various levels of hierarchy of the logic. Lastly, rather than having to verify each of the modified versions back to the reference IC design, the equivalence checking may be performed between each modified IC design version and a next modified IC design version having a greater modification computational complexity.

14 Claims, 3 Drawing Sheets

U.S. PATENT DOCUMENTS

| | | | |
|---|---|---|---|
| 7,567,892 B2 * | 7/2009 | Barrett et al. | ............. 703/14 |
| 2002/0123873 A1 | 9/2002 | Roesner | |
| 2003/0225557 A1 | 12/2003 | Barrett | |
| 2006/0052994 A1 | 3/2006 | Takei | |
| 2008/0263484 A1 | 10/2008 | Kobayashi | |
| 2011/0214097 A1 * | 9/2011 | Nodine | ............. 716/107 |

OTHER PUBLICATIONS

Isles, et al; "Verification Equivalence Certificates for Sequential Optimization;" FMCAD 2009, Formal Methods in Computer Aided Design; Austin, Texas, USA; Nov. 15-18, 2009.

Isles, et al; "A Formal Methodology for Verifying Domino Logic Circuits with Sneak Paths;" International Workshop on Logic Synthesis, Jul. 31-Aug. 2, 2009, Berkeley, California.

International Search Report in application No. PCT/US2009/049930 mailed Jan. 27, 2010.

Nodine; "Automatic Testbench Generation for Rearchitected Designs" Microprocessor Test and Verification Conference 2007, Jun. 10, 2009, pp. 128-136.

Sheeley; "Enhancing Sequential LEC Using a Cumulative Verification Methodology;" Ninth International Workshop on Microprocessor Test and Verification, Austin, TX, Dec. 2008, pp. 39-42.

Nodine; "Preparing Rearchitected Designs for Sequential Equivalence Checking;" Ninth International Workshop on Microprocessor Test and Verification, Austin, TX, Dec. 2008, pp. 27-32.

* cited by examiner

METHOD FOR PREPARING FOR AND FORMALLY VERIFYING A MODIFIED INTEGRATED CIRCUIT DESIGN

This patent application claims the benefit of Provisional Patent Application Ser. No. 61/484,997, filed May 11, 2011, which is herein incorporated by reference in its entirety. This patent application is also a continuation-in-part of U.S. patent application Ser. No. 13/128,153, filed May 6, 2011, which is a National Stage application of International Patent Application No. PCT/US2009/062337, filed Oct. 28, 2009, which claims the benefit of U.S. Provisional Application Ser. No. 61/112,537, filed Nov. 7, 2008, each of which is herein incorporated by reference in its entirety.

BACKGROUND

1. Technical Field

This disclosure relates to integrated circuit (IC) design, and more particularly to formal verification of integrated circuit logic designs.

2. Description of the Related Art

In IC design, formal verification refers to a type of functional validation (verification) method that uses mathematical models of the circuits to prove a property of interest rather than relying upon simulations of individual test cases. An advantage of a formal verification is that it may be equivalent to doing an exhaustive simulation of every possible test case. Exhaustive simulation by itself is not practical for any but the most trivial of circuits because of the size of the state space.

One type of formal verification is referred to as equivalence checking. Equivalence checking is used to verify that two circuits perform the same function, where one circuit is considered to be the reference model, and the other circuit is a design model. For two circuits to be the same, each must have the same number of primary inputs (PIs) and the same number of primary outputs (POs), and there must be some way to identify corresponding inputs/outputs. Many commercial combinatorial equivalence tools may require a complete correspondence between internal sequential elements (e.g., latches or flops) of the two designs. However, because it is often necessary to modify the boundaries of modules and/or change the signal timing on the inter-module boundaries, which may break the correspondence of circuits between sequential elements, this view of equivalence may be too restrictive.

Accordingly, when the matching of sequential elements cannot be assumed, the equivalence checking is referred to as sequential equivalence checking. The sequential equivalence checking problem space may be much larger and harder than that of combinatorial equivalence checking, so application of any algorithms for proving sequential equivalence may fail due to computational complexity. If it were possible to run equivalence checking on the top-level design, nothing else would be necessary. However, because of issues with some sequential equivalence checking tools, it is often difficult to prove sequential equivalence without many iterations and trials.

SUMMARY OF THE EMBODIMENTS

Various embodiments of a method for formally verifying a modified IC design are disclosed. Broadly speaking, a method for preparing an IC design that has been modified to be formally verified with a reference IC design is contemplated. Because many verification tools cannot handle the complexity often associated with sequential verification at the top level of a circuit, the modified IC design may be instantiated into a number of different design versions, each having different levels of modification complexity. In addition, the reference IC design and the modified versions may be decomposed into a datapath and control path. The reference IC design and each of the modified IC design versions may also use wrappers to encapsulate various levels of hierarchy of the logic. Lastly, rather than having to verify each of the modified versions back to the reference IC design, the sequential equivalence checking may be performed between each modified IC design version and a next modified IC design version having a greater modification computational complexity.

In one embodiment, the method includes providing a reference IC design version including a reference logic block. The method may also include creating a plurality of modified IC design versions, each including a modified logic block that corresponds to the reference logic block. The modified logic block may also include one or more modifications relative to the reference logic block. The modifications may increase in computational complexity from one version to a next version. The method may also include decomposing the reference logic block and each of the modified logic blocks into a datapath logic and a control logic. The method may further include verifying sequential equivalence of logic between each modified IC design version and a next modified IC design version having a greater modification computational complexity, beginning with the reference IC design version and a modified IC design version having a least modification computational complexity.

Figure 1:
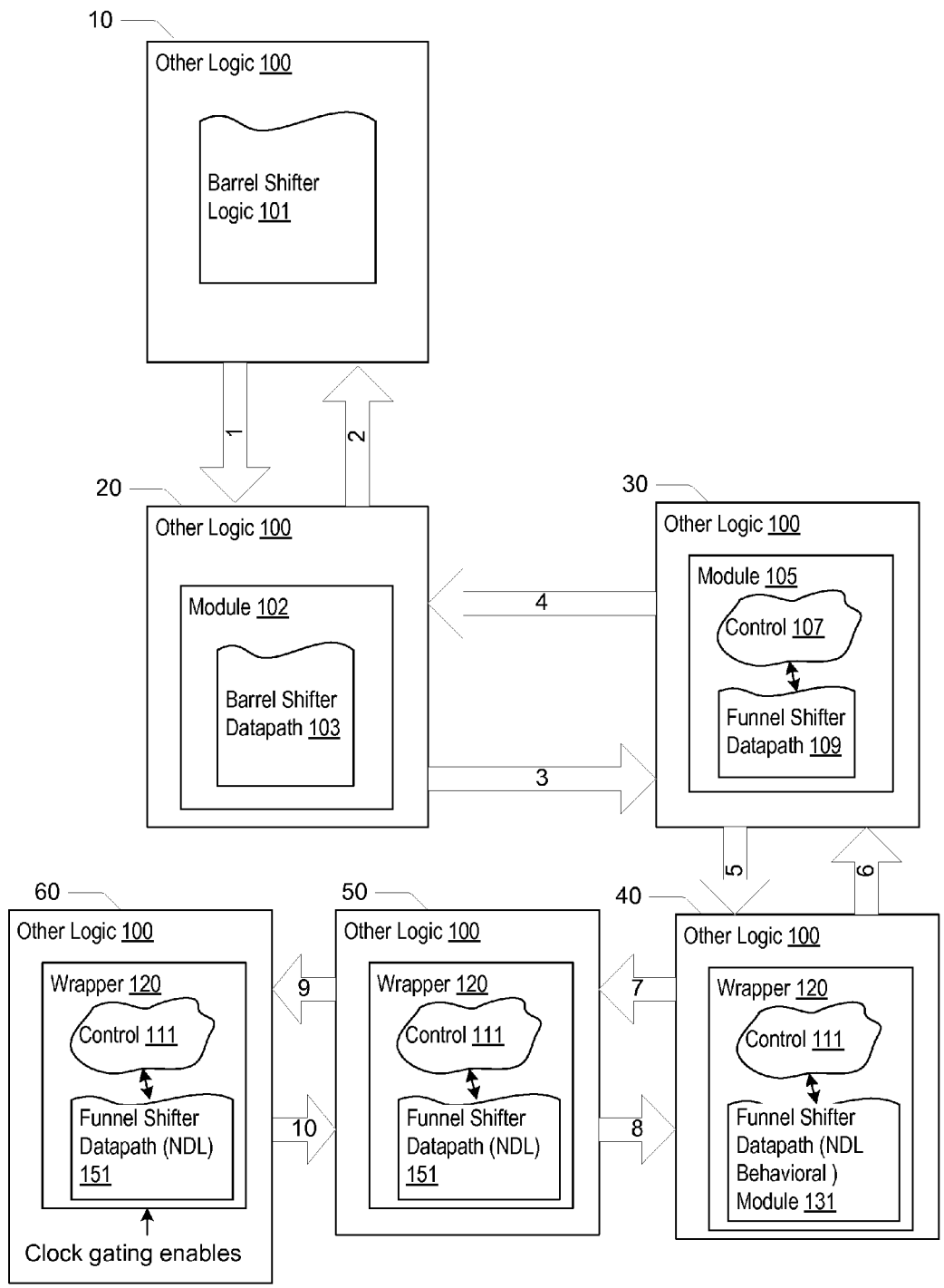
FIG. 1 is a conceptual diagram depicting one embodiment of a process for preparing and formally verifying a modified integrated circuit (IC) design.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/ components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

As mentioned above, sequential equivalence checking of IC designs can be difficult when a modified design includes many modifications and logic edits and/or the state space is large. More particularly, the issue may be described in terms of computational complexity of the computational problem to be solved. In other words, the computational complexity refers to the level of difficulty of the problem being solved by a computer. A problem may be regarded as difficult if solving it requires many resources irrespective of what type of computational algorithm is used. For example, the computational complexity may be considered to increase as the amount of time and/or the amount of memory that is needed to solve the problem increases. In addition, in the issue at hand, the number of gates in the circuit may be a measure of complexity.

In the following example, an original IC design includes a logic block (e.g., the barrel shifter 101 of FIG. 1) that is replaced by another block of logic (e.g., the funnel shifter 109 of FIG. 1). The issue is trying to formally verify that the resultant top-level design that includes the new funnel shifter logic is sequentially equivalent to the top-level design with the barrel shifter. However, the state space for that type of verification becomes intractable for sequential equivalence checking tools. Accordingly, the following discussion describes a way to break the modified design into pieces that can be handled by the tools, using wrapper logic to accommodate changes in connectivity of inputs and outputs at different hierarchies, and separating the datapath logic from the control path. In one embodiment, wrapper logic may be logic that encapsulates a particular group or portion of a logic. The wrapper logic may isolate that portion of the circuit from the rest of the circuit, and provide inputs and outputs that may be connected to the rest of the circuit. In addition, within a wrapper a new level of circuit hierarchy may be created. It is noted that although the exemplary circuit uses a barrel shifter and a funnel shifter, in other embodiments the method and process described below may be used for any type of circuit.

Turning now to FIG. 1, a conceptual diagram depicting one embodiment of a process for preparing and formally verifying a modified integrated circuit (IC) design is shown. In block 10, the original IC design includes other logic 100 and barrel shifter logic 101. In one embodiment, other logic 100 may be representative of logic that surrounds the barrel shifter 101. For example, the other logic 100 may be part of a processor and the barrel shifter logic 101 may be part of the arithmetic logic unit. In this example, the other logic 100 and the barrel shifter 101 may be a hardware definition language (HDL) representation of the circuit such as register transfer level (RTL), for example. As shown in block 20 of FIG. 1, the other logic block 100 is instantiated and a new level of hierarchy is created in the module 102. This is depicted by the arrow number 1. In one embodiment, the control and datapath of the barrel shifter are separated. Datapath logic associated with various shifter functions (e.g. 103) is encapsulated by the new module 102, while the control external to that functionality is outside of the module 102 so that the output of the module 102 may be consumed correctly.

Once the block 20 has been created, the changes made to the hierarchy can be formally verified against the original design, as indicated by arrow number 2 using a sequential equivalence tool. Thus, block 20 is checked against block 10. After these two blocks are verified by the tool, the block 20 is modified to create block 30 where the barrel shifter datapath logic 103 is replaced by funnel shifter datapath logic 109 and additional funnel shifter control logic 107 that is used to convert barrel shifter control signals to funnel shifter control signals. Arrow 3 depicts such a transformation. As shown, block 30 includes a module 105 that is at the same level of hierarchy as module 102 of block 20 and includes the funnel shifter datapath logic 109 and additional funnel shifter control logic 107. In one embodiment, there may be input/output constraints that may be required by certain functions (e.g., one or more reverse shifting functions) of the funnel shifter applied to module 105.

Once block 30 has been created, the changes can be formally verified against the design of block 20, as indicated by arrow number 4 using a sequential equivalence tool. After these two blocks are verified by the tool, the block 30 is modified to create block 40, as indicated by arrow 5.

In block 40, the module 105 is replaced by a wrapper module 120. As shown the wrapper module 120 encapsulates the funnel shifter datapath logic and the funnel shifter control logic. In addition, within the wrapper 120, a new level of hierarchy is created in that an n-ary dynamic logic (NDL) behavioral model of the funnel shifter datapath is instantiated as a new module 131. The control logic block 111 is outside of the module 131 and includes additional flip-flops. In one embodiment, the NDL behavioral model may be an HDL implementation such as Verilog or VHDL, for example. The NDL behavioral model also includes conversion logic to convert the signals coming into the funnel shifter datapath logic from standard binary signals to a 1-of-4 encoding. In addition, a number of flip-flops may be added to the control logic 111 at cycle boundaries to more accurately reflect equivalence of the NDL behavioral model with the actual NDL circuit on a cycle-by-cycle basis.

Once the block 40 has been created, the changes can be formally verified against the design of block 30, as indicated by arrow number 6 using a sequential equivalence tool. After these two blocks are verified by the tool, the block 40 is modified to create block 50, as indicated by arrow 7.

In block 50, the NDL behavioral model of the funnel shifter datapath module 131 is replaced with a new module 151 that includes an NDL representation, which is an actual logic representation of the circuit and is substantially identically functionally equivalent to the NDL behavioral. Thus, the wrapper 120 of block 50 includes the funnel shifter control logic 111, and the new funnel shifter datapath NDL module 151. In one embodiment, clock-gating logic may be placed in the logic. However, to simplify the verification, the clock enables may be tied (constrained), to keep all clock-gating disabled.

Once block 50 has been created, the changes can be formally verified against the design of block 40, as indicated by arrow number 8 using a sequential equivalence tool. In embodiments that include the clock-gating, as a next step the clock-gating may be enabled within the wrapper 120, and the appropriate constraints applied to the wrapper 120. For example, block 60 is created by transforming block 50 as shown by arrow 9 to apply the appropriate clock-gating enable signals to the wrapper 120. An additional sequential equivalence check may be performed between the block 50 with clock-gating disabled, and block 60 with the clock-gating enabled and proper constraints applied.

Accordingly, each new instantiation is only checked for equivalence with the previous version/iteration of the design, thereby reducing the complexity of the state space that the sequential equivalence tool must negotiate. In addition, because with each new hierarchy there may be inputs and outputs that may be different, the wrapper may be wired up to the new module to preserve the correct input and output relationships.

Figure 2:
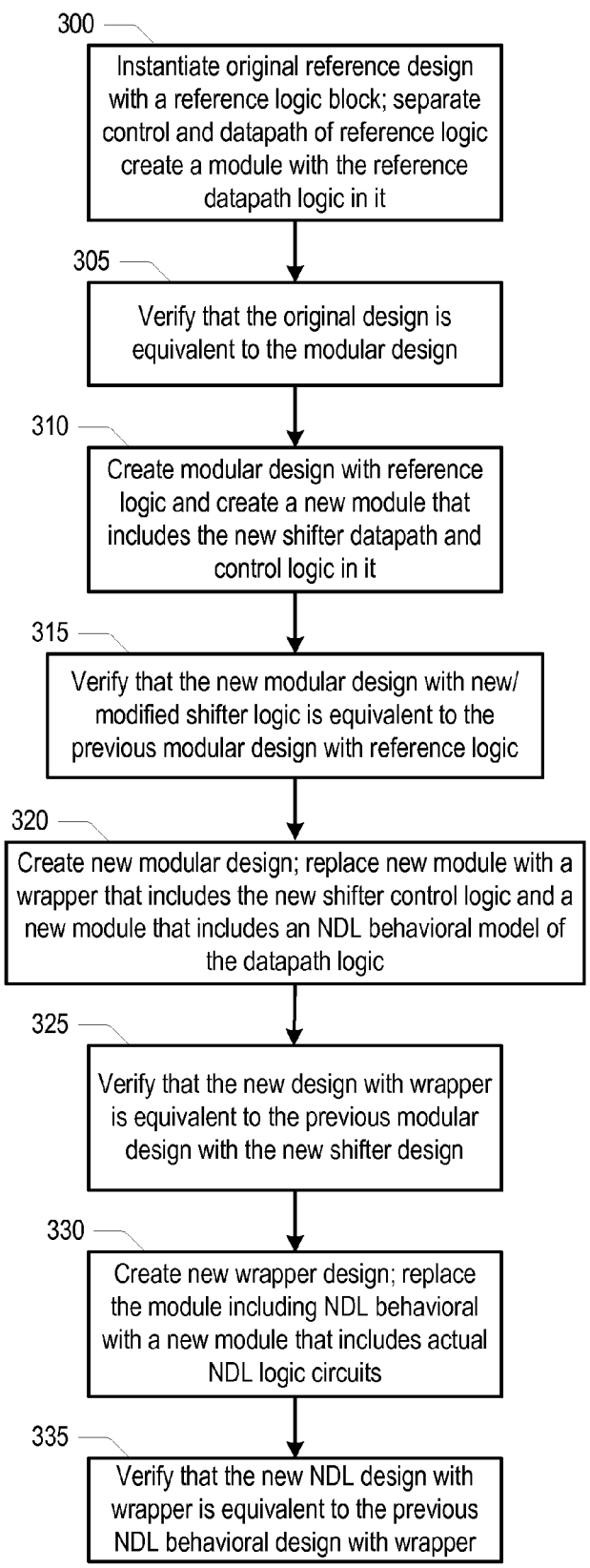
FIG. 2 is a flow diagram describing a method for preparing and formally verifying a modified IC design.

Referring to FIG. 2, a flow diagram describing a method for preparing and formally verifying a modified IC design is shown. Beginning in block 300, the original reference design block is instantiated. A new copy of the block is modified such that the datapath and control logic is separated, and the reference datapath logic block is encapsulated within a new level of hierarchy or module. The outputs of the new module are wired up and connected to the appropriate connections in the surrounding logic. The new modular reference block is verified against the original reference block using a sequential equivalence checking tool (block 305).

If the tool verifies the equivalence, the new modular design is copied and modified. More particularly, the module in the new reference design is replaced with a new module that includes a new/modified logic block (block 310). For example, as shown in FIG. 1, the module 102 and the barrel shifter datapath logic 103 is replaced with the module 105, which includes the funnel shifter datapath logic 109 and the funnel shifter control logic 107. The new modular funnel shifter block is verified against the previous reference block using a sequential equivalence checking tool (block 315).

If the tool verifies the equivalence, the new modular shifter design is copied and modified. More particularly, the module in the new shifter design that includes the shifter datapath and control logic is replaced with a new wrapper that encapsulates the shifter control logic and a new module that includes a behavioral model of the new shifter (block 320). For example, as shown in FIG. 1, the module 105 which includes the funnel shifter datapath logic 109 and the funnel shifter control logic 107 is replaced with a wrapper 120 which encapsulates a new funnel shifter control logic 111 and the module 131, which includes the funnel shifter datapath logic behavioral model. The new wrapper funnel shifter block is verified against the previous modular funnel shifter block using a sequential equivalence checking tool (block 325).

If the tool verifies the equivalence, the new wrapper shifter design is copied and modified. More particularly, the module that includes the shifter datapath behavioral model is replaced with a new module that that includes the actual NDL of the new shifter (block 330). For example, as shown in FIG. 1, the module 131 which includes the funnel shifter datapath NDL behavioral is replaced with a new module that includes the actual funnel shifter datapath logic NDL 151. The new wrapper funnel shifter block with actual NDL is verified against the previous funnel shifter block with the NDL behavioral using a sequential equivalence checking tool (block 335). If the tool verifies the equivalence, the process is essentially complete.

As described in the above embodiments, the logic block datapath and the control paths were separated to facilitate ease of the verification flow. Accordingly, this type of verification flow may be used on any type of logic that includes a datapath and control logic. For example, in addition to shifter logic, adders, multipliers, and the like may be verified using a flow like the flow described above.

Figure 3:
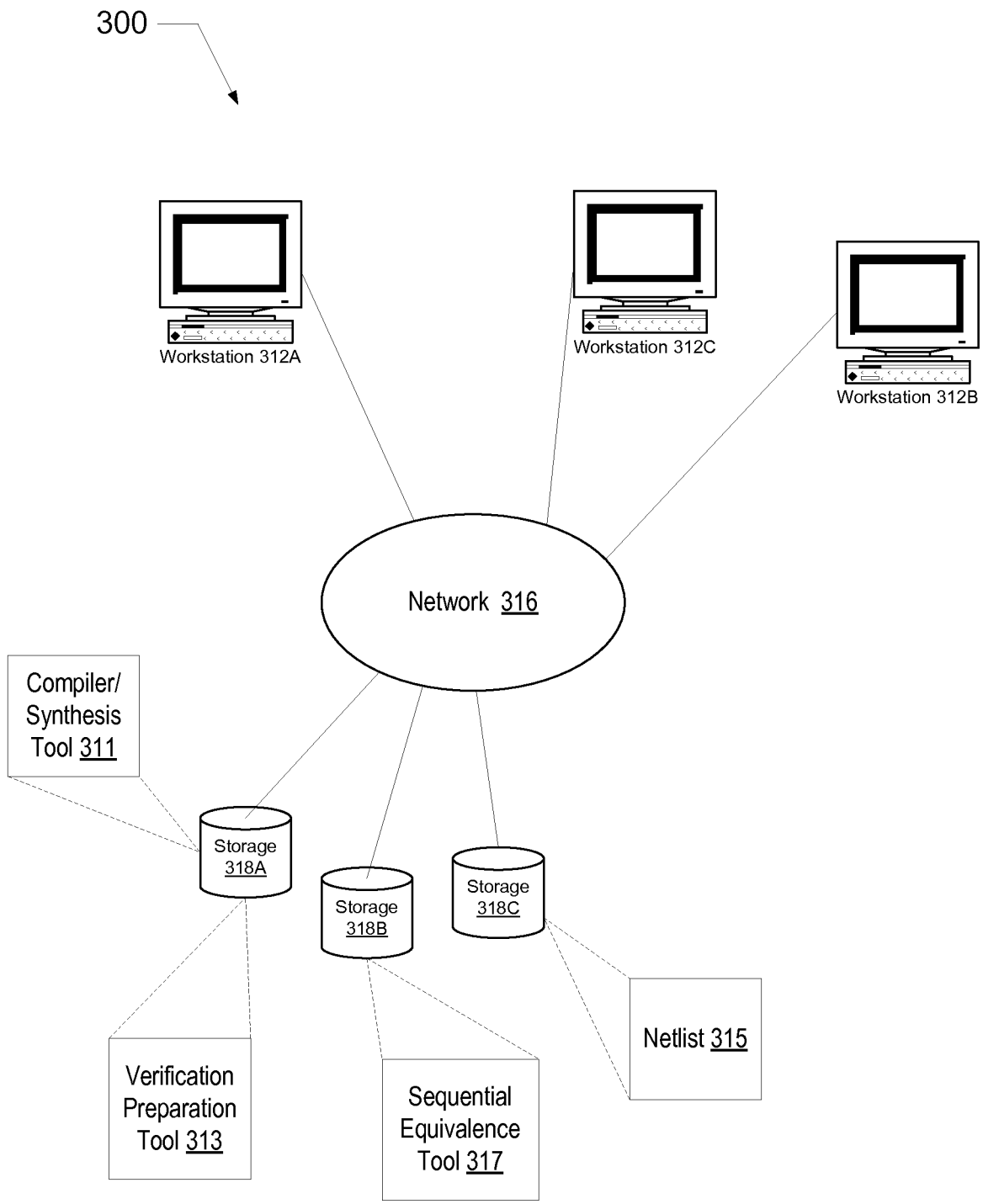
FIG. 3 is a block diagram of one embodiment of a system for implementing a tool for preparation and formal verification of a modified IC design.

In one embodiment, the steps of the formal verification preparation and subsequent sequential equivalence checking may be performed manually on a computer by a user. In other embodiments however, one or more of the steps of the formal verification preparation and subsequent sequential equivalence checking may be performed in a more automated fashion. More particularly, some of the various steps may be performed on a computer by executing instructions that cause one or more electronic design automation (EDA) tools to run. For example, a script or other software routine may prepare files for execution, or make calls to cause a tool to run, and the like. In FIG. 3, one embodiment of a system that may be used to perform various ones of the above steps is shown.

Turning to FIG. 3, a block diagram of one embodiment of a system for implementing a tool for preparation and formal verification of a modified IC design is shown. Computer system 300 includes a plurality of workstations designated 312A through 312C. The workstations are coupled together through a network 316 and to a plurality of storages designated 318A through 318C. In one embodiment, each of workstations 312A-312C may be representative of any standalone computing platform that may include, for example, one or more processors, local system memory including any type of random access memory (RAM) device, monitor, input output (I/O) means such as a network connection, mouse, keyboard, monitor, and the like (many of which are not shown for simplicity).

In one embodiment, storages 318A-318C may be representative of any type of non-transitory computer readable storage device such as hard disk systems, optical media drives, tape drives, ram disk storage, and the like. As such, the program instructions comprising the design tools may be stored within any of storages 318A-318C and loaded into the local system memory of any of the workstations during execution. As an example, as shown in FIG. 3, the compiler/synthesis tool 311 and the verification preparation tool 313 are shown stored within storage 318A, while the netlist 315 is stored within storage 318C. Further, the sequential equivalence checking tool 317 is stored within storage 318B. Additionally, the program instructions may be stored on a portable/removable storage media. The program instructions may be executed directly from the removable media or transferred to the local system memory of a given workstation 312 or mass storages 318 for subsequent execution. As such, the portable storage media, the local system memory, and the mass storages may be referred to as non-transitory computer readable storage mediums. The program instructions may be executed by the one or more processors on a given workstation or they may be executed in a distributed fashion among the workstations, as desired.

In one embodiment, the formal verification preparation tool 313 may be used to prepare an IC design for sequential equivalence checking by the sequential equivalence checking tool 317 as described above. In one embodiment, the formal verification preparation tool 313 may include program instructions written in any of a variety of programming languages or scripting languages, and which may be executable by a processor to perform the above tasks. More particularly, in one embodiment the formal verification preparation tool 313 may receive information that corresponds to the decomposition of the datapath and the control path, and the formal verification preparation tool 313 may encapsulate the datapath into a different module as described above.

It is noted that although the computer system shown in FIG. 3 is a networked computer system, it is contemplated that in other embodiments, each workstation may also include local mass storage. In such embodiments, the program instructions and the results of the design tools may be stored locally. Further, it is contemplated that the program instructions may be executed on a standalone computer such as a personal computer that includes local mass storage and a system memory.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method comprising:
   providing a reference integrated circuit (IC) design version including a reference logic block having control logic and datapath logic;
   creating a plurality of modified IC design versions, each including a modified logic block that corresponds to the reference logic block and that includes one or more modifications relative to the reference logic block, wherein the one or more modifications increase in computational complexity from one version to a next version;
   decomposing the reference logic block and each of the modified logic blocks into a datapath logic block and a control logic block; and
   performing by a processor, verifying sequential equivalence of logic between each modified IC design version and a next modified IC design version having a greater modification computational complexity, beginning with the reference IC design version and a first modified IC design version having a least modification computational complexity;
   wherein the modified logic block within each IC design version is at a same level of hierarchy as the modified logic block in the next IC design version.

2. The method as recited in claim 1, further comprising creating within the reference IC design version a first hierarchy that encapsulates the datapath logic block of the reference logic block.

3. The method as recited in claim 2, further comprising creating within each of the modified IC design versions a second hierarchy that encapsulates the datapath logic block of the modified logic block.

4. The method as recited in claim 3, further comprising creating within each of the modified IC design versions a wrapper to encapsulate the second hierarchy and the control logic block.

5. The method as recited in claim 1, wherein decomposing the reference logic block into a datapath logic block and a control logic block includes separating the datapath logic from the control logic and encapsulating the datapath logic block within a new module.

6. A method comprising:
   providing a reference integrated circuit (IC) design version including a reference logic block having control logic and datapath logic;
   creating a plurality of modified IC design versions, each including a modified logic block that corresponds to the reference logic block and that includes one or more modifications relative to the reference logic block, wherein the one or more modifications increase in computational complexity from one version to a next version;
   decomposing the reference logic block and each of the modified logic blocks into a datapath logic block and a control logic block; and
   performing by a processor, verifying sequential equivalence of logic between each modified IC design version and a next modified IC design version having a greater modification computational complexity, beginning with the reference IC design version and a first modified IC design version having a least modification computational complexity;
   wherein verifying sequential equivalence of logic between each modified IC design version and a next modified IC design version having a greater modification computational complexity includes instantiating a given modified IC design version and performing additional modifications to create a corresponding next modified IC design, and verifying sequential equivalence of logic between the given modified IC design version and the corresponding next modified IC design.

7. A non-transitory computer readable storage medium including program instructions for preparing an integrated circuit (IC) design for formal sequential equivalence checking, the program instructions are executable by a processor to:
   provide a reference integrated circuit (IC) design version including a reference logic block having datapath logic and control logic;
   create a plurality of modified IC design versions, each including a modified logic block that corresponds to the reference logic block and that includes one or more modifications relative to the reference logic block, wherein the one or more modifications increase in computational complexity from one version to a next version;
   receiving information that corresponds to a decomposition of the reference logic block and each of the modified logic blocks into a datapath logic block and a control logic block; and
   verify sequential equivalence of logic between each IC design version and a next IC design version having a greater modification computational complexity, beginning with the reference IC design version and a first modified IC design version having a least modification computational complexity;
   wherein the program instructions are further executable by the processor to instantiate a given modified IC design version and perform additional modifications to create a corresponding next modified IC design, and verify sequential equivalence of logic between the given modified IC design version and the corresponding next modified IC design.

8. The computer readable storage medium as recited in claim 7, wherein the program instructions are further executable by the processor to create a new hierarchy of logic to encapsulate the modified logic blocks of each of the modified IC design versions.

9. The computer readable storage medium as recited in claim 7, wherein the program instructions are further executable by the processor to encapsulate the datapath logic block within a new module in response to receiving information identifying a separation of the datapath logic and the control logic.

10. A system comprising:
a memory storing program instructions for preparing an integrated circuit (IC) design for formal sequential equivalence checking;
a processor coupled to the memory, wherein the processor, in response to executing the instructions is configured to:
provide a reference integrated circuit (IC) design version including a reference logic block having datapath logic and control logic;
create a plurality of modified IC design versions, each including a modified logic block that corresponds to the reference logic block and that includes one or more modifications relative to the reference logic block, wherein the one or more modifications increase in computational complexity from one version to a next version;
decompose the reference logic block and each of the modified logic blocks into a datapath logic block and a control logic block; and
verify sequential equivalence of logic between each IC design version and a next IC design version having a greater modification computational complexity, beginning with the reference IC design version and a first modified IC design version having a least modification computational complexity;
wherein the modified logic block within each IC design version is at a same level of hierarchy as the modified logic block in the next modified IC design version.

11. The system as recited in claim 10, wherein the processor is further configured to create a new hierarchy of logic to encapsulate the modified logic blocks of each of the modified IC design versions.

12. The system as recited in claim 10, wherein the processor is further configured to create within the reference IC design version a first hierarchy that encapsulates the datapath logic block of the reference logic block.

13. The system as recited in claim 12, wherein the processor is further configured to create within each of the modified IC design versions a second hierarchy that encapsulates the datapath logic block of the modified logic block.

14. A method comprising:
providing a reference integrated circuit (IC) design version including a reference logic block;
separating a datapath logic and a control logic within the reference logic block;
encapsulating the datapath logic within a module that has a different level of hierarchy than the control logic within the reference IC design version;
creating a plurality of modified IC design versions from the reference IC design, wherein each modified IC design version includes a modified logic block that corresponds to the reference logic block and that includes one or more modifications relative to the reference logic block, wherein the one or more modifications increase in computational complexity from one version to a next version;
performing by a processor, verifying sequential equivalence of logic between the reference IC design version and a first modified IC design version having a least modification computational complexity;
iteratively verifying sequential equivalence of logic between each modified IC design version and a next modified IC design version having a greater modification computational complexity;
wherein the modified logic block within each IC design version is at a same level of hierarchy as the modified logic block in the next modified IC design version.

* * * * *